(12) United States Patent
Tanaka et al.

(10) Patent No.: US 8,097,961 B2
(45) Date of Patent: Jan. 17, 2012

(54) SEMICONDUCTOR DEVICE HAVING A SIMPLIFIED STACK AND METHOD FOR MANUFACTURING THEREOF

(75) Inventors: Junji Tanaka, Tokyo (JP); Koji Taya, Kanagawa (JP); Masahiko Harayama, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 109 days.

(21) Appl. No.: 12/341,863

(22) Filed: Dec. 22, 2008

(65) Prior Publication Data
US 2009/0321958 A1 Dec. 31, 2009

(30) Foreign Application Priority Data

Dec. 21, 2007 (JP) ................................. 2007-331183

(51) Int. Cl.
*H01L 23/48* (2006.01)
*H01L 23/52* (2006.01)
*H01L 29/40* (2006.01)

(52) U.S. Cl. ........................ 257/784; 257/786
(58) Field of Classification Search .................. 257/784, 257/666, 86, 777, 723, 724
See application file for complete search history.

(56) References Cited

U.S. PATENT DOCUMENTS

| | | | | |
|---|---|---|---|---|
| 5,847,458 A * | 12/1998 | Nakamura et al. | ............ | 257/738 |
| 6,201,292 B1 * | 3/2001 | Yagi et al. | ...................... | 257/666 |
| 6,498,099 B1 * | 12/2002 | McLellan et al. | ............. | 438/689 |
| 6,723,585 B1 * | 4/2004 | Tu et al. | ......................... | 438/123 |
| 7,608,930 B2 * | 10/2009 | Kasuya et al. | ................. | 257/779 |
| 7,671,451 B2 * | 3/2010 | Lee et al. | ...................... | 257/666 |
| 7,683,461 B2 * | 3/2010 | Lau | ............... | 257/666 |
| 7,709,935 B2 * | 5/2010 | Islam et al. | ................... | 257/666 |
| 7,750,443 B2 * | 7/2010 | Kadoi | ............................ | 257/666 |
| 2005/0248041 A1 * | 11/2005 | Kuah et al. | .................... | 257/787 |

\* cited by examiner

*Primary Examiner* — S. V Clark

(57) ABSTRACT

Embodiments of the present invention are directed to provide a semiconductor device including a semiconductor chip formed of a conductive material, a connector terminal around the semiconductor chip, which is formed of a same material for forming the semiconductor chip, an insulating member for electrically insulating the semiconductor chip from the connector terminal, and a first connection member for electrically coupling the semiconductor chip with the connector terminal. Simplified step of manufacturing the connector terminal may further simplify the steps of manufacturing the semiconductor device.

15 Claims, 7 Drawing Sheets

SEMICONDUCTOR DEVICE HAVING A SIMPLIFIED STACK AND METHOD FOR MANUFACTURING THEREOF

CLAIM OF PRIORITY

This application claims priority from Japanese patent application 2007-331183 filed on Dec. 21, 2007

TECHNICAL FIELD

The present invention relates to a semiconductor device and a method for manufacturing thereof, and more particularly, to a semiconductor device employed for forming a stack type semiconductor device, and a method for manufacturing thereof.

BACKGROUND

The recent trend of miniaturizing sophisticated electronic devices has led to a corresponding increase in the demand for improved packaging density of the semiconductor devices mounted on the electronic device. A popular technique for improving packaging density is a stack type semiconductor device produced through chip-on-chip technology and package-on-package technology.

Japanese Unexamined Patent Application Publication No. 2005-11856 discloses a semiconductor device which allows vertical electric coupling by burying a through hole formed in a pseudo wafer for fixing a semiconductor chip with a conductive resin. Japanese Unexamined Patent Application Publication No. 2003-218283 discloses a semiconductor device with a protruding electrode formed on a substrate mounted with a semiconductor chip for establishing a vertical electric coupling.

A stack type semiconductor device requires a connector terminal to be formed for electrically coupling with other semiconductor chips or the semiconductor package when stacking. Conventionally, an additional manufacturing step is required for forming the connector terminal (for example, formation of a through hole and a through electrode). Accordingly, with the addition of the step for forming the connector terminal, improving the fabrication yield to reduce manufacturing costs is difficult to achieve.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to an aspect of the present invention, a semiconductor device is provided which includes a semiconductor chip formed of a conductive material, a connector terminal formed of the same material with the semiconductor chip, and is formed around the semiconductor chip, an insulating member for electrically insulating the semiconductor chip from the connector terminal, and a connection member for electrically coupling the semiconductor chip with the connector terminal. The simplified manufacturing step of the connector terminal advantageously simplifies the manufacturing steps of the semiconductor device.

According to another aspect of the present invention, a stack type semiconductor device is provided in which a plurality of semiconductor devices is stacked. Two vertically adjacent semiconductor devices among the plurality of semiconductor devices have an upper and lower surface of their respective connector terminals electrically coupled via a connection member.

According to yet another aspect of the present invention, a stack type semiconductor device is provided in which a plurality of semiconductor devices is stacked, and among the plurality of semiconductor devices that is stacked, two of the vertically adjacent semiconductor devices have side surfaces of their respective connector terminals electrically coupled via a connection member.

According to a further aspect of the present invention, a method is provided for manufacturing a semiconductor device that includes forming a portion of a second region into at least one connector terminal in a semiconductor wafer formed of a conductive material including a first region to be formed into a semiconductor chip after cutting, and the second region which is located around the first region and is not formed into the semiconductor chip after cutting; electrically insulating the first region from the connector terminal, and electrically coupling the first region with the connector terminal. This makes it possible to advantageously simplify the manufacturing step of the connector terminal so as to simplify the manufacturing steps of the semiconductor device.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the claimed subject matter, semiconductor device having a simplified stack and a method for manufacturing thereof, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Figure 1:
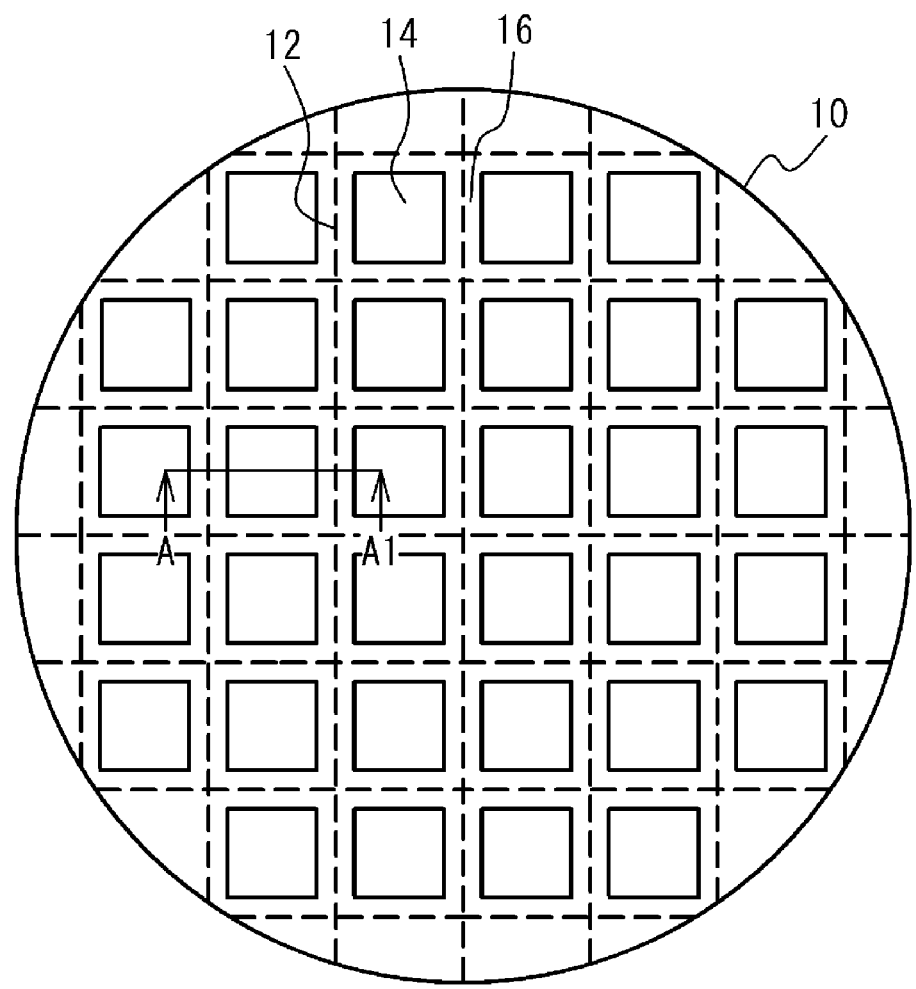
FIG. 1 is a top view showing a step of manufacturing a semiconductor device according to various embodiments.

A method for manufacturing a semiconductor device 100 according to one embodiment will be described with reference to FIGS. 1 and 2A through 2D. FIG. 1 is a top view of a semiconductor wafer 10 prior to a step of cutting the semiconductor device 100. Referring to FIG. 1, the semiconductor wafer 10 is formed of a conductive material, for example, conductive silicon, and cut along predetermined dicing lines 12 into pieces to form a plurality of semiconductor devices 100. The semiconductor wafer 10 includes a first region, which is to be cut off into the semiconductor chip and defined as chip regions 14, and a second region (i.e. a second region to be formed into the portion other than the semiconductor chip after cutting), which is defined as dicing regions 16. The dicing region 16 is formed as a margin for cutting the semiconductor wafer 10 so as not to damage the chip regions 14. The dicing region 16 has a width of, for example, approximately 160 μm along the dicing line 12. Referring to the drawing, the chip regions 14 are regularly arranged in the vertical and horizontal directions on the semiconductor wafer 10, and the dicing regions 16 are formed around the respective chip regions 14.

Figure 2A:
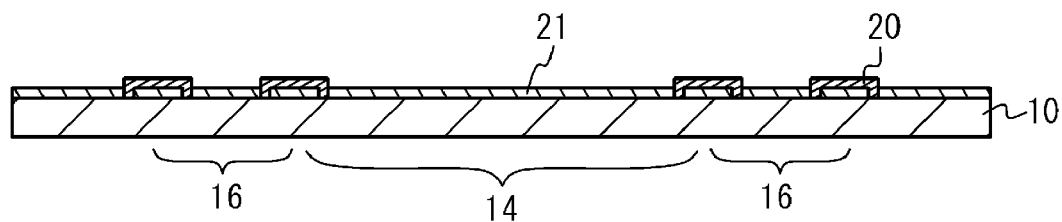
FIGS. 2A to 2D are sectional views showing the steps of manufacturing the semiconductor device according to various embodiments.

FIGS. 2A to 2D are sectional views each taken along line A-A1 shown in FIG. 1. Referring to FIG. 2A, an insulating layer 21 is formed on the upper surface of the semiconductor wafer 10. Then a redistribution layer 20 is formed as a first connection member on a part of the insulating layer 21 so as to electrically couple the chip region 14 with the dicing region 16. The redistribution layer 20 is formed of such metal as Al and Cu, and electrically coupled with an integrated circuit formed on the chip region 14 via an external connector terminal (not shown) on the upper surface of the chip region 14. In one embodiment, no integrated circuit is formed on the dicing region 16.

Figure 2B:
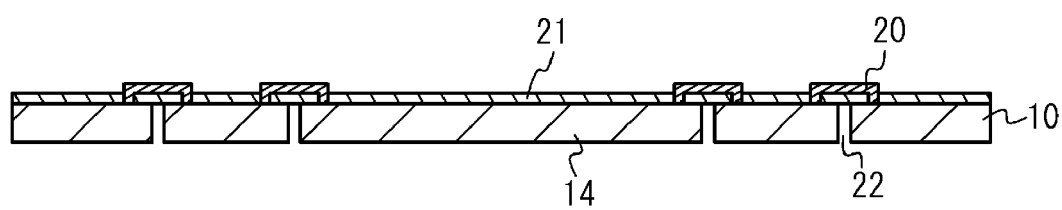

Referring to FIG. 2B, a groove 22 is formed between the chip region 14 and the dicing region 16 by etching the lower surface (opposite the surface on which the redistribution layer 20 is formed) of the semiconductor wafer 10. The groove 22 passes through the wafer 10 so as to prevent direct contact between the chip region 14 and the dicing region 16. When forming a plurality of connector terminals 32 (see FIG. 3A) on the dicing regions 16, the grooves 22 are formed between adjacent regions designed to be the connector terminals 32. The groove 22 may be formed by dicing instead of etching.

Figure 2C:
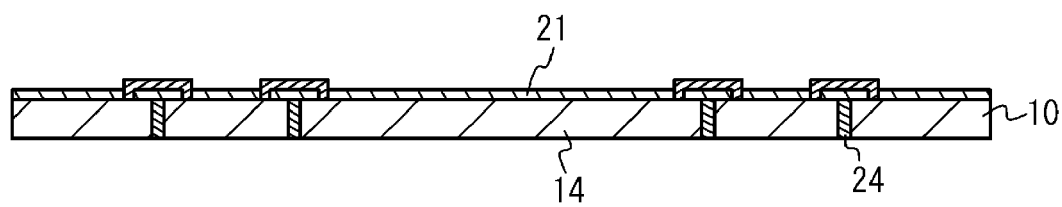

Referring to FIG. 2C, the groove 22 is filled with an insulating resin 24 as an insulating member (for example, epoxy adhesive agent) so as to cover the side surfaces of the chip region 14 and the dicing region 16. The insulating resin 24 filled in the groove 22 serves to mechanically connect a side surface of the chip region 14 to that of the dicing region 16. Accordingly, the chip region 14 may be incapable of separating from the dicing region 16 even after dicing. In the aforementioned step, the chip region 14 and the dicing region 16 are electrically insulated (except the electrically coupled portion with the redistribution layer 20).

Figure 2D:
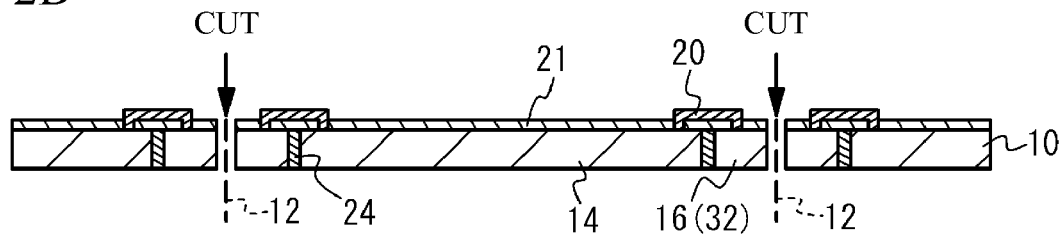

Referring to FIG. 2D, the semiconductor wafer 10 is cut along the predetermined dicing lines 12. The remaining portions of the dicing region 16 after cutting become the connector terminals 32 so as to be connected to the other semiconductor device when stacking. In other words, the dicing region 16 of the semiconductor wafer 10 is partially formed into the connector terminals 32 in the aforementioned steps shown in FIGS. 2B to 2D.

In one embodiment, the dicing region 16 of the semiconductor wafer 10 as depicted in FIG. 1 has a width of 160 μm, and the blade used for cutting as shown in FIG. 2D has the width of 30 μm, the connector terminal 32 can be formed into a square having sides of approximately 50 μm in length.

Figure 3A:
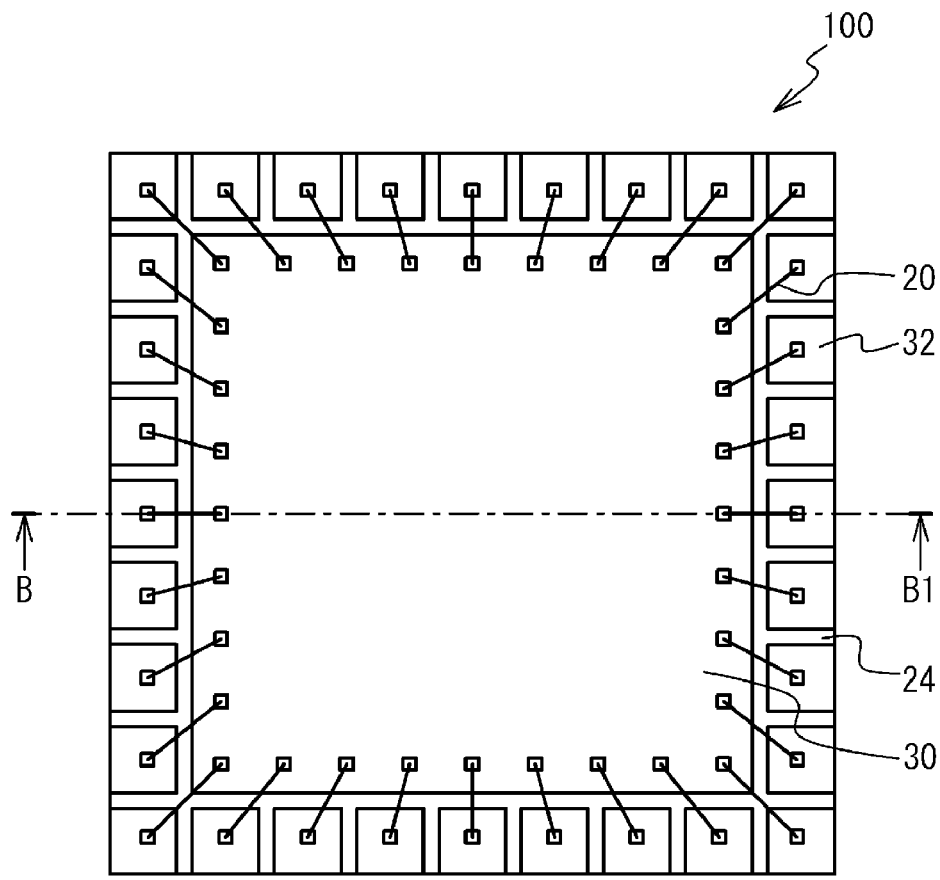
FIG. 3A is a top view of the semiconductor device according to various embodiments.
Figure 3B:
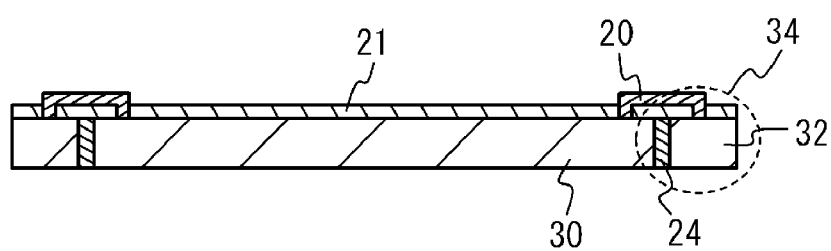
FIG. 3B is a sectional view taken along line B-B1 of FIG. 3A according to various embodiments.

FIG. 3A is a top view of the semiconductor device 100 according to one embodiment. FIG. 3B is a sectional view taken along line B-B1 shown in FIG. 3A. Referring to FIG. 3A, a semiconductor chip 30 is a logic chip or a memory chip formed of a conductive material, and contains an integrated circuit (not shown) therein. In one embodiment, the connector terminals 32 are formed around the semiconductor chip 30. The connector terminal 32 and the semiconductor chip 30 are cut from the same semiconductor wafer 10 (see FIG. 1), and accordingly, formed of the same conductive material. In further embodiments, the semiconductor chip 30 and the connector terminals 32 each have substantially the same thickness and are positioned in the same plane.

Referring to FIGS. 3A and 3B, the semiconductor chip 30 and the connector terminals 32 are insulated with the insulating resin 24. Specifically, the insulating resin 24 is formed to cover side surfaces of the semiconductor chip 30 and the connector terminals 32 so as to prevent the semiconductor chip 30 from directly contacting with the connector terminals 32. As shown in the drawing, the semiconductor device 100 includes a plurality of connector terminals 32. Therefore, the insulating resin 24 is formed to cover the respective side surfaces of the plurality of connector terminals 32 so as to prevent the plurality of connector terminals 32 from being directly in contact with one another.

Referring to FIGS. 3A and 3B, the semiconductor chip 30 is electrically coupled with the connector terminal 32 with the redistribution layer 20 as a first connection member. The redistribution layer 20 is electrically coupled with the integrated circuit formed inside the semiconductor chip 30 via the external connector terminal (not shown) formed on the upper surface of the semiconductor chip 30. Therefore, for example, when mounting the semiconductor device 100 on the other semiconductor device or an interposer, the semiconductor chip 30 can be electrically coupled with the outside via the redistribution layer 20 and the connector terminal 32. On the upper surfaces of the semiconductor chip 30 and the connector terminal 32, the portion except the area in contact with the redistribution layer 20 is covered with the insulating layer 21.

Figure 4:
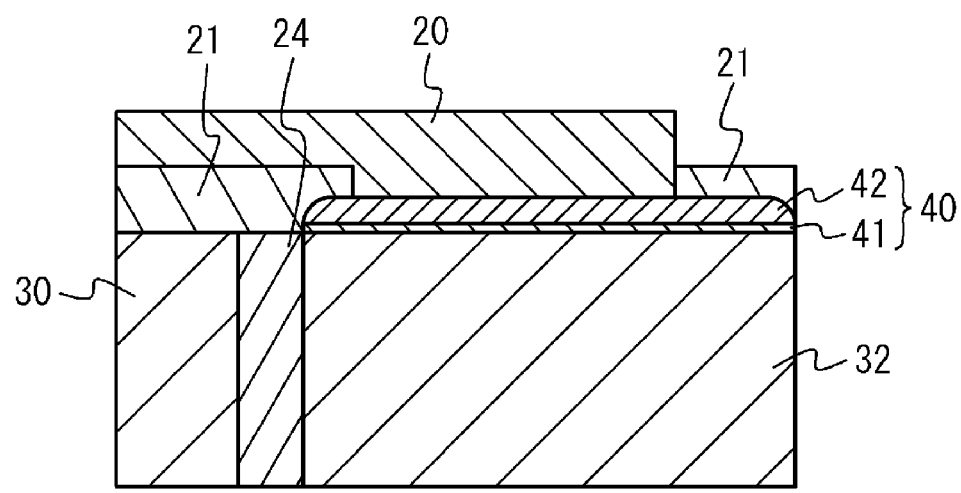
FIG. 4 is a sectional view showing the semiconductor device according various embodiments.

The redistribution layer 20 and the connector terminal 32 may be directly contacted, but it is preferable to apply plating on the contact surface of the connector terminal 32. FIG. 4 shows a structure of a portion around the connector terminal 32 (region 34 shown in FIG. 3B) of the semiconductor device 100 according to one embodiment. Referring to FIG. 4, a metal layer 40, which is formed of a Titanium (Ti) layer 41 and an Gold (Au) layer 42, is formed on the upper surface of the connector terminal 32. Both the Ti layer 41 and the Au layer 42 are deposited on the surface of the connector terminal 32 through the sputtering process prior to the step of forming the redistribution layer 20 shown in FIG. 3A. The redistribution layer 20 is electrically coupled with the connector terminal 32 via the metal layer 40. The metal layer 40 may be formed to cover at least a portion of the surface of the connector terminal 32. Instead of Ti and Au, such metal as Nickel (Ni) and Protactinium (Pa) may be used for forming the metal layer 40.

The connector terminal 32 of the semiconductor device 100 according to the one embodiment is formed of the same conductive material for forming the semiconductor chip 30. This makes it possible to use the upper, lower and side surfaces of the connector terminal 32 to be electrically coupled with the other semiconductor device and the interposer. As a result, the plurality of semiconductor devices 100 can be stacked to improve the packaging density of the semiconductor device. As the connector terminal 32 is formed as the semiconductor, the electrical resistivity is higher than that of the metal electrode. However, the entire electrical resistivity can be sufficiently reduced by decreasing the thickness of the semiconductor wafer 10 to the sufficient level (for example, to 30 μm), and sufficiently increasing the cross section area of the connector terminal 32.

In a conventional stack type semiconductor device, the connector terminal is formed by three steps, that is, forming the through hole, applying the insulating member (insulating resin) to the inner wall of the through hole, and then filling the through hole with the conductive member (such metal as copper) to form the through electrode. The step of forming the through electrode may cause the manufacturing defect owing to bubble incorporation or the like. In one embodiment, a portion of the dicing region 16 of the semiconductor wafer 10 is used as the connector terminal 32 as shown in FIGS. 2A to 2D. This makes it possible to eliminate the step of forming the through electrode by filling the through hole with the conductive member.

As shown in FIGS. 2A to 2D, in the step of manufacturing the semiconductor device 100, the connector terminal 32 is formed by performing etching (or dicing) and redistribution. The manufacturing step of the connector terminal 32 according to one embodiment is technically simple compared with the case requiring the formation of the through electrode, and can be performed in a short period of time. Accordingly, the steps of manufacturing the semiconductor device 100 may be simplified relative to conventionally employed manufacturing steps, thus improving the fabrication yield and suppressing the manufacturing cost. As the connector terminal 32 is formed using the dicing region 16 (see FIG. 1) which has been considered as the unnecessary portion, the size of the thus produced semiconductor device is kept compact.

In one embodiment, at least a portion of the surface of the connector terminal 32 is covered with the metal layer 40, through which the redistribution layer 20 is electrically coupled with the connector terminal 32. The reliability with respect to the connection between the redistribution layer 20 and the connector terminal 32 may be improved, thus further improving the fabrication yield of the semiconductor device 100. Preferably, the region of the connector terminal 32 connected to the redistribution layer 20 has the impurity concentration higher than that of the other region. This makes it possible to further improve the reliability with respect to the connection between the redistribution layer 20 and the connector terminal 32.

In one embodiment, the redistribution layer 20 is used as the first connection member for electrically coupling the semiconductor chip 30 with the connector terminal 32. However, the first connection member is not limited to the aforementioned member. For example, the bonding wire can be used for the connection instead of the redistribution layer 20.

In another embodiment, the conductive silicon is used for forming the semiconductor wafer 10. However, any other material may be used for forming the semiconductor wafer 10 so long as it is the conductive semiconductor material. For example, a germanium semiconductor or a gallium arsenide semiconductor can be employed.

According to one aspect, the plurality of connector terminals 32 is arranged along four sides of the semiconductor chip 30. However, the number and the arrangement of those connector terminals 32 are not limited to the one as described above. For example, the connector terminals 32 may be arranged along at least one side of the semiconductor chip 30. Referring to FIG. 3A, the semiconductor chip 30 has been presented from a rectangular top view. However, the semiconductor chip may have any other shape.

Figure 5:
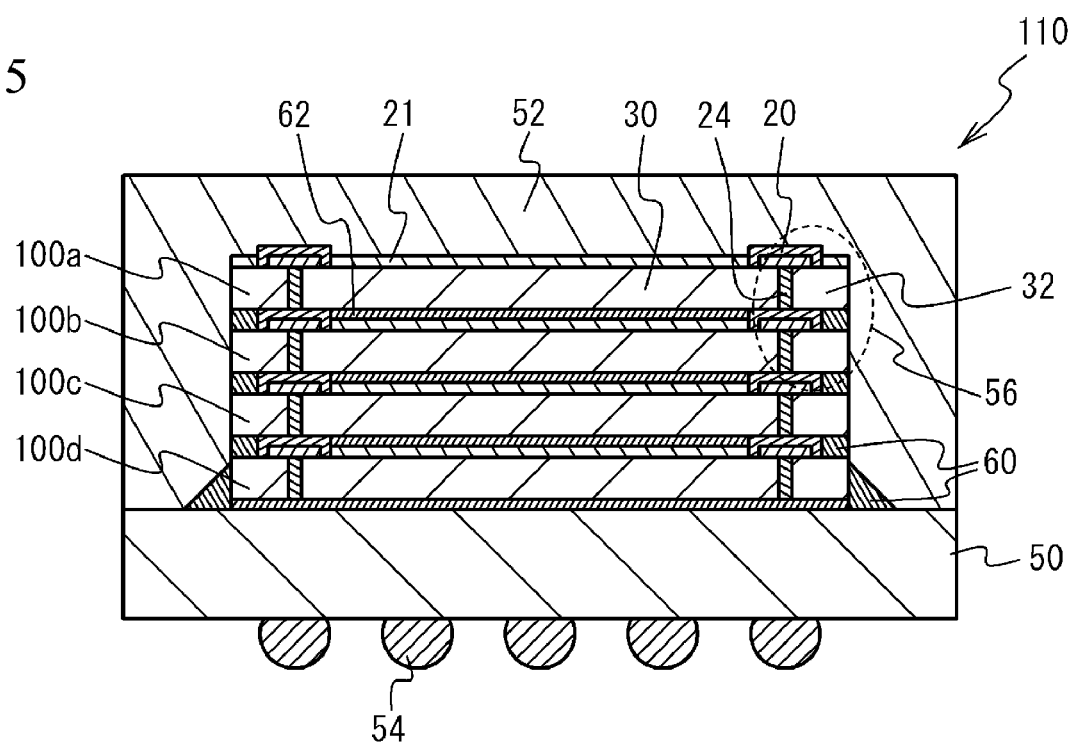
FIG. 5 is a sectional view of a semiconductor device according to various embodiments.
Figure 6:
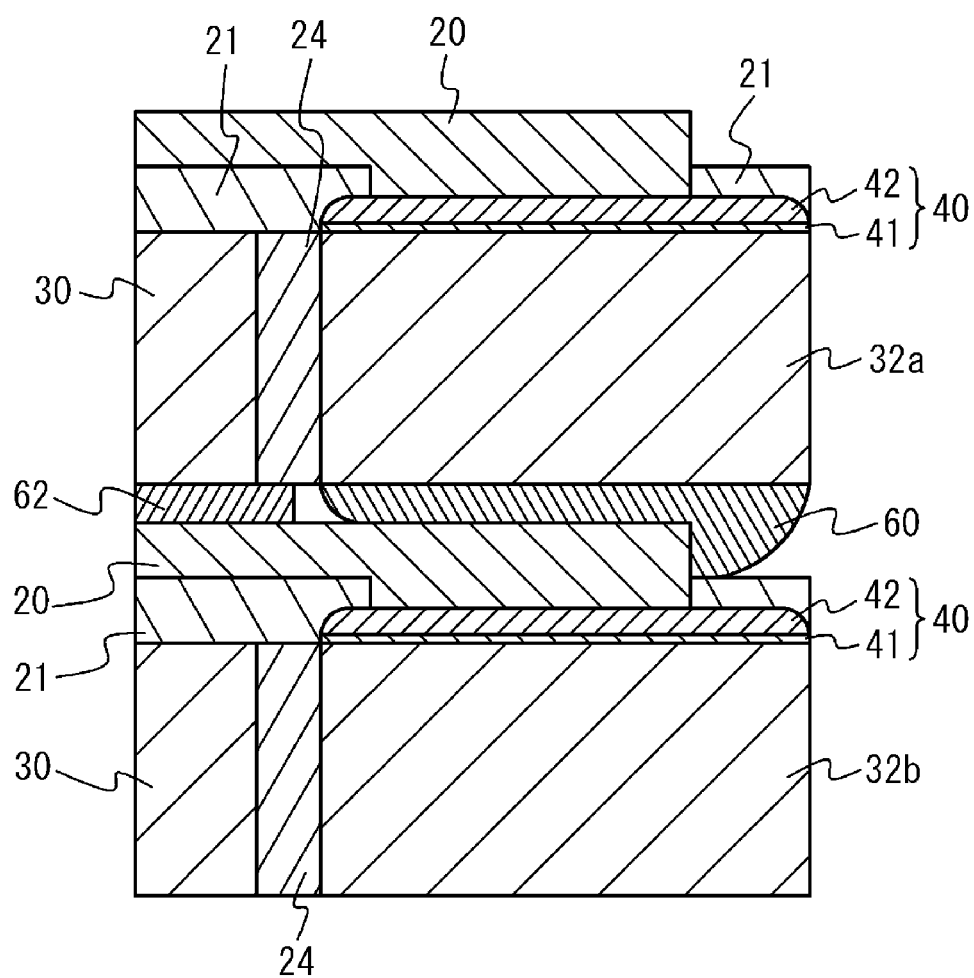
FIG. 6 is a sectional view of the semiconductor device according to various embodiments.

According to another aspect of the invention, a plurality of semiconductor devices 100 according to one or more of the above described embodiments is stacked. FIGS. 5 and 6 are sectional views each showing a stack type semiconductor device 110 according to another embodiment.

Referring to FIG. 5, semiconductor devices 100a to 100d, each having structures similar to that of the semiconductor device 100 as described above with reference to FIGS. 1 and 2A through 2D, are stacked and mounted on the upper surface of an interposer 50 via adhesive agents 62. The semiconductor devices 100a to 100d are molded with a molding resin 52 formed on the upper surface of the interposer 50. A plurality of solder balls 54 for external connection is formed on the lower surface of the interposer 50 so as to be electrically coupled with the wiring (not shown) on the upper surface of the interposer 50.

The semiconductor devices 100a to 100d are electrically coupled with one another via metal pastes 60 as the second connection member that are bonded to the upper surface and the lower surface of the respective connector terminals 32. In other words, two vertically adjacent semiconductor devices (for example, 100a and 100b) have the lower surface of the connector terminal 32 of the upper semiconductor device 100a electrically coupled with the upper surface of the connector terminal 32 of the lower semiconductor device 100b via the metal paste 60. The side surface of the connector terminal 32 of the lowermost semiconductor device 100d is electrically coupled with a wiring pattern (not shown) on the interposer 50 via the metal paste 60.

FIG. 6 is an enlarged view showing a portion (region 56) around a connector terminal of the stack type semiconductor device 110 shown in FIG. 5. The metal paste 60 as the second connection member is formed on the lower surface of the upper connector terminal 32a and is connected to the upper surface (redistribution layer 20 and metal layer 40) of the lower connector terminal 32b. The metal paste 60 may be formed of Silver (Ag) paste or solder, for example.

FIG. 6 shows the metal paste 60 as the second connection member used for electrically coupling the adjacent connector terminals. However, other member (for example, conductive resin) may be employed instead of the metal paste 60. The lower surface of the upper connector terminal 32a may be plated with such metal as Au so that the metal paste is formed on the plated surface.

The stack type semiconductor device 110 according to one embodiment is formed by stacking a plurality of semiconductor devices 100, in which the connector terminals 32 of the respective semiconductor devices 100 are electrically coupled via metal pastes 60. This makes it possible to enhance the packaging density of the semiconductor device. The upper and the lower surfaces of the connector terminals 32 are used for electrically coupling the semiconductor devices. Each area of the upper and the lower surfaces of the connector terminal 32 are easily increased compared with the area of the side surface. Further, since the metal paste 60 as the second connection member is interposed between the upper and the lower connector terminals, there is no concern that the metal peels, compared with the case where the side surface of the connector terminal 32 is used for the connection. This makes it possible to improve reliability with respect to the electric coupling.

FIGS. 5 and 6 show the stacked semiconductor devices 100 electrically coupled via upper and lower surfaces of the respective connector terminals 32. Alternatively, the semiconductor devices 100 may be electrically coupled via the side surfaces of the respective connector terminals 32.

Figure 7:
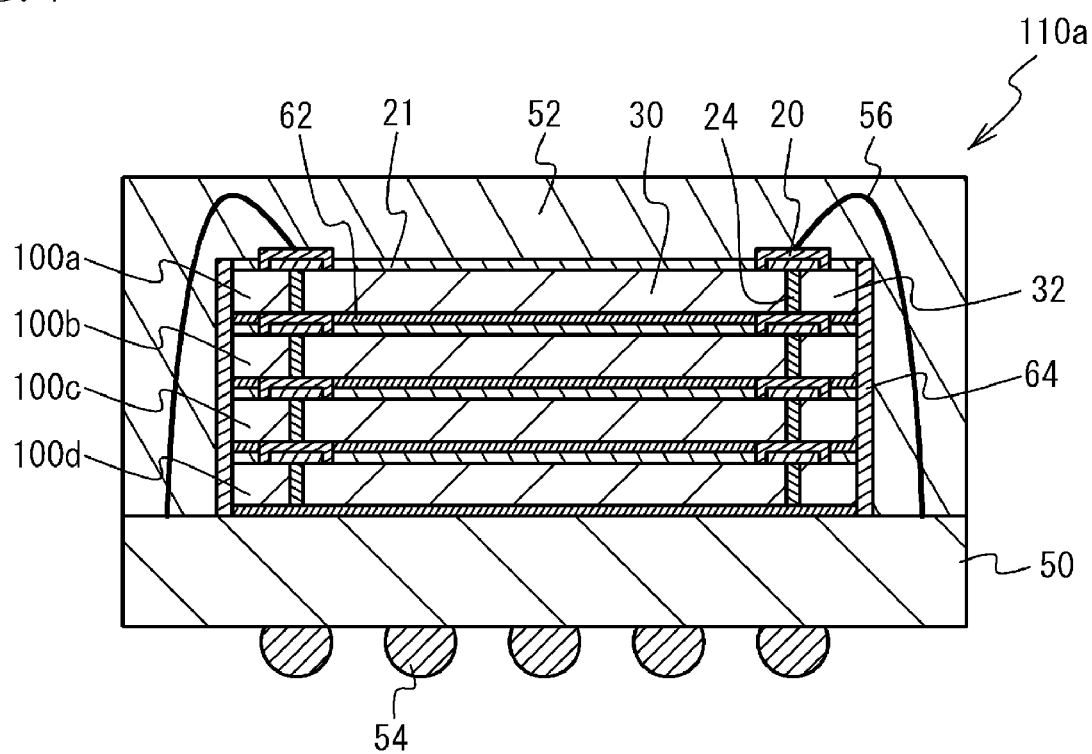
FIG. 7 is a sectional view of a modified example of the semiconductor device according to various embodiments.

FIG. 7 shows a structure of a stack type semiconductor device 110a as a modified example of an alternate embodiment. The semiconductor devices 100a to 100d are stacked on the upper surface of the interposer 50, which are molded with the molding resin 52. The semiconductor devices 100a to 100d are electrically coupled via side surface wirings 64, which are third connection members, formed on the side surfaces of the respective connector terminals 32. The connector terminal 32 of the uppermost semiconductor device 100a is electrically coupled with a wiring pattern (not shown) on the interposer 50 via a bonding wire 56. In one embodiment, the other structure is the same as that embodiment described with reference to FIG. 5.

Referring to FIG. 7, the two vertically adjacent semiconductor devices (for example, 100a and 100b) have the side surface of the connector terminal 32 of the upper semiconductor device 100a electrically coupled with the side surface of the connector terminal 32 of the lower semiconductor device 100b via the side surface wiring 64.

The side surface wiring 64 as the third connection member can be formed of such material as copper (Cu) and aluminum (Al). The third connection member may be formed of any material, for example, the conductive resin or solder instead of the side surface wiring 64 so long as it is capable of electrically coupling the side surfaces of the connector terminals 32 of the vertically adjacent semiconductor devices 100.

The stack type semiconductor device 110a of one embodiment is structured to connect the semiconductor devices 100a to 100d using side surfaces of the respective connector terminals 32. This makes it possible to form the stack type semiconductor device using the side surface wiring. In the aforementioned embodiment, examples of electric coupling, in which the side surfaces of the connector terminals 32, or the upper and lower surfaces of the adjacent connector terminals are electrically couples, are described. The electric coupling can further be performed by combining the aforementioned examples. That is, the upper or the lower surface of the connector terminal 32 of one of the semiconductor devices 100 may be electrically coupled with the side surface of the connector terminal of the other semiconductor device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A semiconductor device comprising:
   a semiconductor chip formed of conductive silicon;
   a connector terminal formed of the same material as is the semiconductor chip, wherein the connector terminal is disposed around the semiconductor chip;
   an insulating member for electrically insulating the semiconductor chip from the connector terminal; and
   a first connection member for electrically coupling the semiconductor chip with the connector terminal,
   wherein the semiconductor device is formed by electrically insulating the semiconductor chip from the connector terminal via the insulating member, and electrically coupling the semiconductor chip with the connector terminal via the first connection member.

2. The semiconductor device according to claim 1, wherein the insulating member covers a plurality of side surfaces of the semiconductor chip and the connector terminal.

3. The semiconductor device according to claim 2, wherein the plurality of side surfaces of the semiconductor chip and the connector terminal are covered by the insulating member such that the semiconductor chip and the connector terminal are not in direct contact with each other.

4. The semiconductor device according to claim 1, wherein a plurality of connector terminals is arranged along at least one side of the semiconductor chip.

5. The semiconductor device according to claim 4, wherein the insulating member covers a plurality of side surfaces of the plurality of connector terminals so as to prevent the plurality of connector terminals from being in direct contact with one another.

6. The semiconductor device according to claim 1, wherein;
   the connector terminal comprises a surface covered with a metal layer; and
   the connection member is electrically coupled with the connector terminal via the metal layer.

7. The semiconductor device according to claim 1, wherein each of the semiconductor chip and the connector terminal comprises a conductive silicon material.

8. The semiconductor device according to claim 1, wherein the connection member comprises a redistribution layer.

9. The semiconductor device according to claim 1, wherein the connection member comprises a bonding wire.

10. A stack type semiconductor device comprising a plurality of stacked semiconductor devices, the plurality of stacked semiconductors comprising:
    a first semiconductor device comprising a first semiconductor chip, a first connector terminal disposed around the first semiconductor chip, a first insulating member for electrically insulating the semiconductor chip from the connector terminal and a first connection member for electrically coupling the semiconductor chip with the first connector terminal wherein the first connector terminal and the first semiconductor device are formed from the same material and wherein that material is conductive silicon; and
    a second semiconductor device comprising a second semiconductor chip, a second connector terminal disposed around the second semiconductor chip, a second insulating member for electrically insulating the semiconductor chip from the second connector terminal and a second connection member for electrically coupling the semiconductor chip with the second connector terminal;
    wherein a first surface of the first connector terminal is electrically coupled with a second surface of the second connector terminal.

11. The stack type semiconductor device of claim 10, wherein
    the plurality of stacked semiconductors comprises a plurality of vertically stacked semiconductors; and
    the first semiconductor device is vertically adjacent to the second semiconductor device.

12. The stack type semiconductor device of claim 10, wherein the first surface of the first connector terminal is a side surface of the first connector terminal.

13. The stack type semiconductor device of claim 12, wherein the second surface of the second connector terminal is a side surface of the second connector terminal.

14. The stack type semiconductor device of claim 10, wherein:

the first semiconductor device is stacked on top of the second semiconductor device; and the first surface of the first connector terminal comprises a lower surface of the first connector terminal.

15. The stack type semiconductor device of claim 14, wherein the second surface of the second connector terminal comprises an upper surface of the second connector terminal.

\* \* \* \* \*